United States Patent [19]

Guo

[11] Patent Number: 5,538,603
[45] Date of Patent: Jul. 23, 1996

[54] APPARATUS AND PROCESS FOR INCREASING UNIFORMITY OF SPUTTERING RATE IN SPUTTERING APPARATUS

[75] Inventor: Xin S. Guo, Mountain View, Calif.

[73] Assignee: Applied Materials, Inc., Santa Clara, Calif.

[21] Appl. No.: 326,140

[22] Filed: Oct. 19, 1994

Related U.S. Application Data

[63] Continuation of Ser. No. 63,539, May 19, 1993, abandoned.

[51] Int. Cl.[6] ................................................ C23C 14/34
[52] U.S. Cl. ........................ 204/192.12; 204/298.11; 204/298.12; 204/298.18
[58] Field of Search ................... 204/192.12, 298.11, 204/298.12, 298.18, 298.19

[56] References Cited

U.S. PATENT DOCUMENTS

| | | | |
|---|---|---|---|
| 3,630,881 | 12/1971 | Lester et al. | 204/298.12 X |
| 3,985,635 | 10/1976 | Adam et al. | 204/298.12 X |
| 4,551,216 | 11/1985 | Argyo | 204/298.12 X |
| 5,133,850 | 7/1992 | Kukla et al. | 204/298.12 |

FOREIGN PATENT DOCUMENTS

| | | | |
|---|---|---|---|
| 0440377 | 1/1991 | European Pat. Off. | H01J 37/34 |
| 0150482 | 9/1981 | Germany | 204/298.12 |
| 9017728 | 11/1991 | Germany | C23C 14/35 |
| 60-200962 | 10/1985 | Japan | C23C 14/36 |
| 0014865 | 1/1988 | Japan | 204/298.12 |
| 0105968 | 5/1988 | Japan | 204/298.12 |

*Primary Examiner*—Nam Nguyen
*Attorney, Agent, or Firm*—John P. Taylor

[57] ABSTRACT

An improvement in a sputter deposition apparatus and process for sputtering is described wherein the surface of the sputtering target, adjacent its outer edge, is provided with a taper which reduces the redeposition rate thereon of back scattered atoms previously sputtered from the target surface. When the sputtering apparatus includes a magnetron, the modified target acts to decrease the distance of the ions in the plasma from the magnetron to thereby increase the deposition rate adjacent the tapered portion of the target. The angle of the tapered portion of the target, with respect to the central portion of the target surface, must be at least about 30°, and preferably varies from about 35° to about 70°, and most preferably from about 40° to about 60°. In a preferred embodiment, a second taper extends outwardly of the first taper to provide a more uniform gap between the outer edge of the target and the portion of the shield parallel to the wall of the sputtering apparatus. The angle of the second tapered surface will range from about 70° to about 85°, with respect to the central portion of the target surface, preferably from about 75° to about 83°, and typically from about 78° to about 80°. That is the angle of the outermost tapered surface on the sputtering target, with respect to a plane perpendicular to the central portion of the target surface, may vary from about 5° to about 20°, preferably from about 7° to about 15°, and typically from about 10° to about 12°.

21 Claims, 4 Drawing Sheets

1

APPARATUS AND PROCESS FOR INCREASING UNIFORMITY OF SPUTTERING RATE IN SPUTTERING APPARATUS

This is a continuation of application Ser. No. 08/063,539 filed on May 19, 1993, abandoned.

BACKGROUND OF THE INVENTION

1. Field of the Invention

This invention relates to an apparatus and a process for sputtering which is useful in the formation of integrated circuit structures on semiconductor wafers. More particularly, this invention relates to an apparatus and a process for increasing the uniformity of the sputtering rate of sputtering apparatus useful in the formation of integrated circuit structures on semiconductor wafers.

2. Description of the Related Art

In the deposition of materials onto a substrate by sputtering from a target, the sputtered atoms from the target are scattered in various directions, including back to the target where they may then be resputtered by the ions, e.g., argon ions, impinging on the target. However, sputtered atoms which are scattered back to redeposit on the target do not adhere well to the target. Therefore, if such atoms are not resputtered, they may build up as a poorly bonded mass of materials which eventually flake off, giving rise to undesirable particle formation in the deposition chamber.

Unfortunately, the sputtering rate is not uniform across the entire face of the target, in part due to the presence of a grounded shield adjacent the periphery of the target which serves to protect the walls of the deposition chamber from deposition of the sputtered atoms. Thus, while the scattering and redeposition of sputtered atoms in the chamber is fairly uniform, sputtering of the redeposited atoms (i.e., resputtering) is not uniform, with less of the redeposited atoms being resputtered adjacent the periphery of the target (which is usually circular in shape).

When a single material such as a metal, e.g., titanium, is being sputtered, the sputtering rate is usually sufficient that the above-described redeposition does not create a problem. That is, the resputtering rate is still sufficient to inhibit excessive build up of redeposited metal at the edges of the target.

However, when reactive sputtering is carried out in the deposition reactor, wherein the sputtered metal atoms react with a gas in the chamber to form a metal compound on the surface where the metal atoms deposit, such a metal compound may have a lower sputter rate than the metal itself. When the sputtered metal atoms redeposits on the target surface and react with the reactive gas to form the metal compound, this metal compound is sometimes resputtered at an insufficient rate to prevent or inhibit the undesirable build up of a poorly adherent mass, thus giving rise to the above described undesirable formation of particles in the chamber as the metal compound flakes off the target surfaces where it has formed.

This redeposition and particle formation problem has been found to be of particular importance in the reactive sputter deposition of titanium nitride on a substrate surface, e.g., the surface of a semiconductor wafer. The sputtered titanium atoms, when scattered and redeposited onto the target surface, react with the nitrogen gas in the chamber to form titanium nitride on the target surface. This titanium nitride, in turn, sputters at a lower rate than does titanium metal. When the titanium nitride forms at the periphery of the target surface, the combination of redeposition and a lowered resputtering rate results in a gradual build up of poorly adherent titanium nitride at the periphery or edge of the target, thus giving rise to particle formation as the material flakes off the target.

It would, therefore, be desirable to provide a sputtering apparatus and a process capable of reducing the amount of such redeposition of the sputtered material at the edge of the target and/or to increase the sputtering rate, at the edges of the target, of the redeposited material; particularly when reactive sputtering is carried out in the apparatus and the redeposited material forms a compound by reaction of the initially redeposited material with a reactive gas present in the sputter deposition chamber.

SUMMARY OF THE INVENTION

It is, therefore, an object of this invention to provide an improved apparatus and process for sputter deposition, and in particular for reactive sputtering, wherein redeposition of sputtered material at the edge of a target is inhibited, while the sputter rate at the edge of the target is enhanced.

In accordance with the invention, in a sputter deposition apparatus, the surface of a sputtering target adjacent the outer edge of the target is provided with a taper which reduces the redeposition rate thereon of back scattered atoms previously sputtered from the target surface. When the sputtering apparatus includes a magnetron, the modified target acts to decrease the distance of the ions in the plasma from the magnetron to thereby increase the deposition rate adjacent the tapered portion of the target. The angle of the tapered portion of the target, with respect to the central portion of the target surface, must be at least about 30° and preferably varies from about 35° to about 70°, and most preferably from about 40° to about 60°. In a preferred embodiment, a second taper extends outwardly of the first taper to provide a more uniform gap between the outer edge of the target and the portion of the shield parallel to the wall of the sputtering apparatus. The angle of the second tapered surface will range from about 70° to about 85°, with respect to the central portion of the target surface, and preferably from about 75° to about 83°. That is the angle of the outermost tapered surface on the sputtering target, with respect to a plane perpendicular to the central portion of the target surface, may vary from about 5° to about 20°, and preferably from about 7° to about 15°.

DETAILED DESCRIPTION OF THE INVENTION

Figure 1:
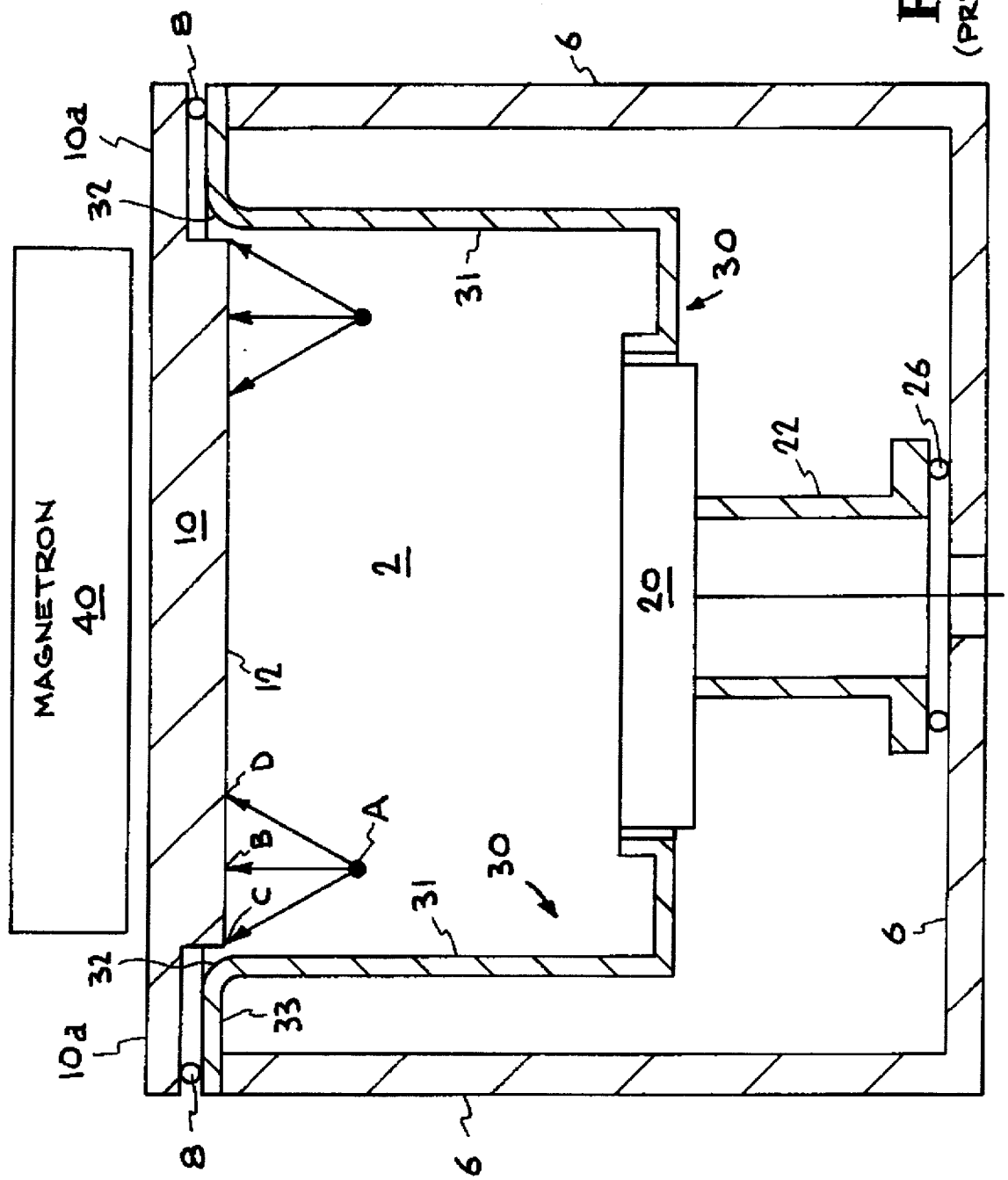
FIG. 1 is a fragmentary vertical cross sectional view of a prior art sputter deposition apparatus showing the back scattering of sputtered atoms back to the surface of the target.

Referring now to FIG. 1, a typical prior sputter deposition apparatus is shown (in skeleton form) comprising a chamber 2, having a grounded chamber wall 6; a generally circular target 10; a wafer support member 20; and a generally circular shield 30 which surrounds target 10. Above target 10 is positioned a magnetron 40 which generates a magnetic field within chamber 2 to influence the travel of ionized gases within chamber 2.

Target 10 comprises a generally circular central portion having a generally planar surface 12 thereon and a wing portion 10a which is used to mount target 10 in chamber 2. Target 10 is electrically insulated from grounded chamber wall 6 by appropriate insulation means such as o-ring 8, which also provides a seal between chamber wall 6 and target 10. When an ionizable gas such as argon is admitted into chamber 2, it is ionized by placing a potential on target 10, e.g., –500 volts DC, by a power source (not shown).

Wafer support member 20 may be grounded or, as shown, be isolated from ground using insulation means such as the illustrated o-ting insulator 26, between chamber wall 6 and wafer support pedestal 22, which also provides a seal therebetween. Shield 30, which is maintained at ground potential, comprises a skirt portion 31 parallel to chamber wall 6, an angled portion at 32, and a flange portion 33. Skirt portion 31 acts to protect walls 6 from deposition thereon of sputtered material from target 10.

As shown in FIG. 1, a sputtered atom, such as a titanium atom, for example, may collide with a gas ion at representative point A and be redirected back to front surface 12 of target 10 to impinge thereon at point B, if the angle of travel of the reflected atom is normal to the plane of target 10. More likely, however, the sputtered atom will travel back to target 10 at some angle to thereby strike target 10 at representative points C or D. While redeposit of the sputtered atom onto target 10 at representative points B or D will present no problem from the standpoint of resputtering of the redeposited material, redeposit of the sputtered material at representative point C adjacent the end edge of target 10 can create a problem because the sputtering rate adjacent the edge of target 10 is lower than the sputtering rate in the central portions of target 10. This is because the plasma of ionized gas is not as dense adjacent skirt portion 31 of grounded shield 30.

Thus redeposit of sputtered material on the front surface of target 10 adjacent the end edge of target 10, e.g., at point C, can result in a build up of poorly adhering material which eventually can flake off, thereby causing particles to be present in chamber 2 which may fall onto the surface of a wafer placed on wafer support 20 for processing in chamber 2.

It will be noted, however, that the illustrated redeposit of sputtered material is shown impacting target 10 at point C at an angle from the point of collision A between the sputtered atom and a gas ion with which it collided. While collision point A and redeposition point C are only intended to be representative, most redepositions at representative point C will be at some angle other than perpendicular because, as mentioned above, the ion density of the plasma is not as great adjacent grounded shield 30, hence fewer collisions will occur at points adjacent shield 30 which could result in perpendicular impacts with target 10 at representative point C.

Figure 2:
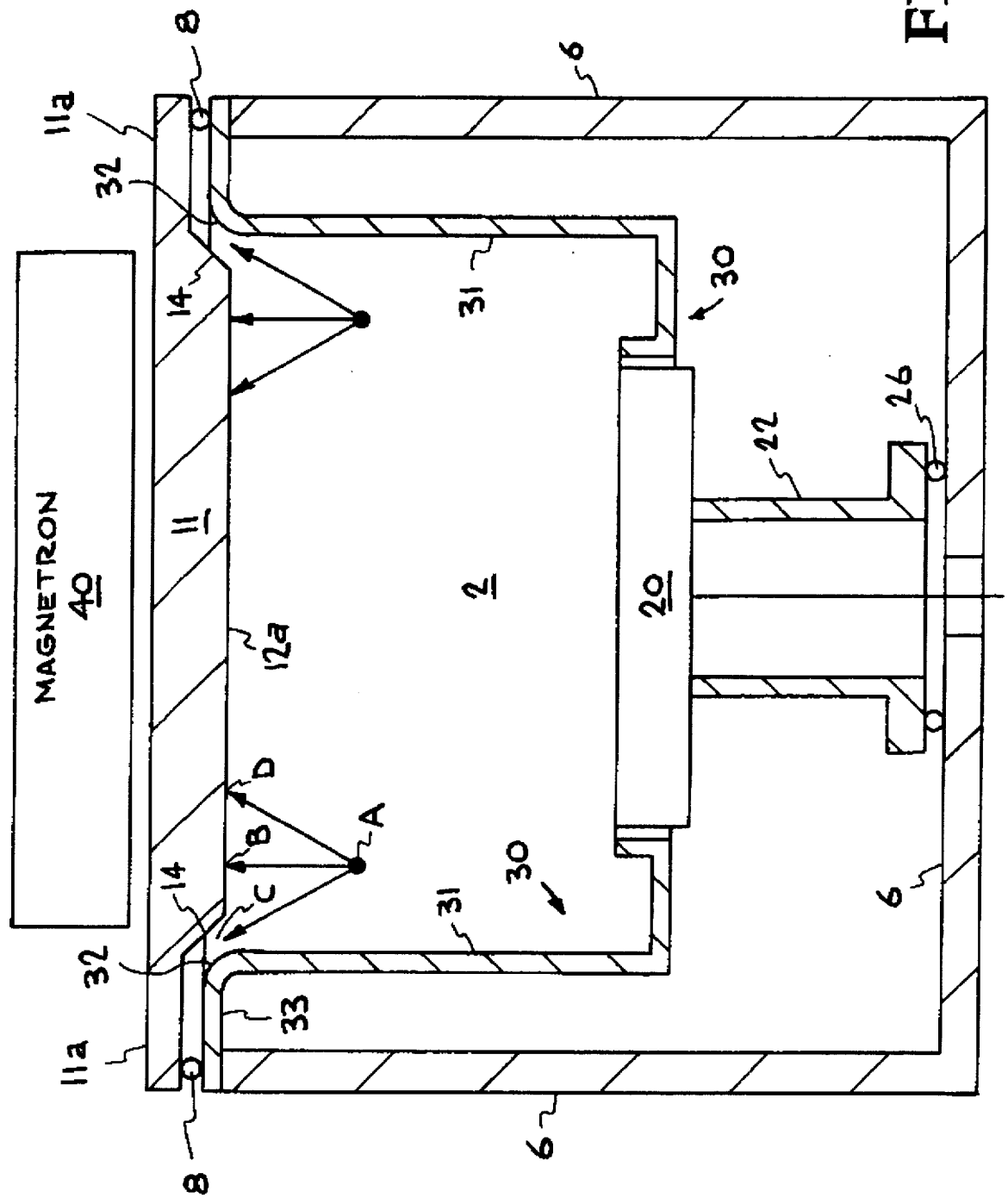
FIG. 2 is a fragmentary vertical cross sectional view of the sputter deposition apparatus of FIG. 1 provided, however, with the target of the invention showing the difference in the amount of back scattered sputtered atoms which will strike the surface of the target at the periphery of the target where the tapered surface has been provided.
Figure 3:
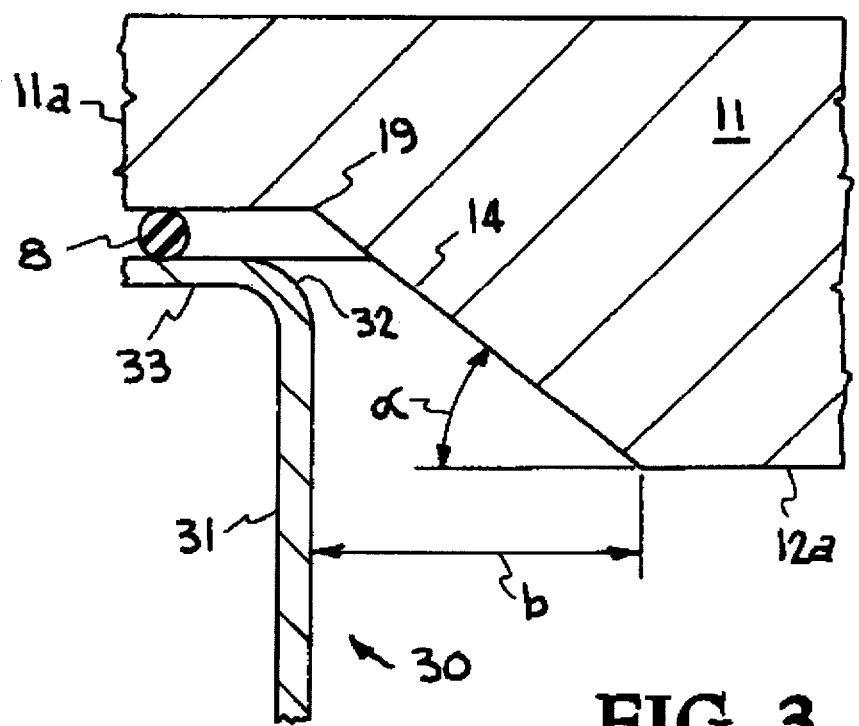
FIG. 3 is an enlarged fragmentary vertical side section view of a portion of FIG. 2, showing the angle and dimensions of the tapered surface of the target.

Therefore, in accordance with the invention, as shown in FIGS. 2 and 3, target 11 of the invention is formed with a tapered or slanted surface 14 which is positioned at an angle $\alpha$ to the plane of front surface 12a of target 11. Angle $\alpha$ must be at least about 30°, and preferably may vary from about 35° to about 70°. Most preferably, angle $\alpha$ will vary from about 40° to about 60°. By providing this large of a taper at the edge of target 11, i.e., this large of a value for angle $\alpha$, most of the reflected atoms will not redeposit on the edge or periphery of target 11.

As shown in FIG. 3, slanted or tapered surface portion 14 of target 11 will commence at a distance b from skirt portion 31 of shield 30. Distance b may vary from greater than about 5 millimeters (mm) to less than about 20 mm, i.e., from greater than about 0.2 inches to less than about 0.8 inches. Preferably, distance b will vary from about 10 mm to about 15 mm (about 0.4 inches to about 0.6 inches) and typically distance b will be about 12.5 mm (about 0.5 inches). Tapered surface 14 terminates at point 19 on wing portion 11a of target 11 which is used to mount target 11 in chamber 2. Point 19 on target 11 approximates the point at which skirt portion 31 of shield 30 would, if extended, intersect target 11.

It should be noted at this point that the previously described apparatus (shown in FIG. 1) may be used with the modified target of the invention without modification of the remainder of the apparatus which is, therefore, designated by the same numerals in FIG. 2.

As shown in FIG. 2, when a sputtered atom collides with an ion at point A and is reflected back to point C, i.e., is reflected back toward target 11 at the same angle as would have resulted in a deposit on the surface of target 10 at point C in Figure 1, the provision of tapered surface 14, in accordance with the invention, causes the reflected sputtered atom to miss surface 12a (and also surface 14) of target 11. The result is a substantial reduction in the amount of redeposition of sputtered atoms adjacent the end edge of target 11, i.e., on surface 14. That is, the very area where resputtering traditionally is the weakest will have a reduced rate of redeposition, resulting in a reduced build up of redeposited material available to subsequently flake off and cause undesirable particle formation in the deposition chamber.

It should be further noted that an additional benefit of the provision of tapered surface 14 is an effective gradual thinning of the total thickness of target 11. This is a benefit because the magnetic field strength of magnetron 40 positioned adjacent target 11 varies with the square of the distance and the stronger the magnetic field, the more the sputter rate will be enhanced. Therefore, where target 11 is thinnest, the magnetic field is strongest, resulting in an enhancement of the sputter rate in such a region. Since normally the region of target 11 closest to grounded shield 30 will have the lowest plasma density, and therefore, the lowest sputtering rate, such an increase in the magnetic field and its resultant beneficial effect on the sputtering rate in the space adjacent tapered surface 14 will further enhance the process, since any sputtered material which may still redeposit on tapered surface 14 will then more likely be resputtered off of tapered surface 14 of target 11.

While the provision of tapered or slanted surface 14 will provide a reduction in the amount of sputtered material redeposited onto surface 14 of target 10, as well as providing an increase in the resputtering ram in the region adjacent tapered surface 14, i.e., adjacent grounded shield 30, the tapered gap which results between tapered surface 14 and the corner 32 of shield 30 can, in some instances, be detrimental. This is because the provision of such a tapered surface can result in redeposition of the reflected atoms on o-ring 8.

While it is not completely understood why this variable gap may be detrimental, it is preferred that the gap between shield 30 and target 11 be constant or at least not be expanding until shield 30 turns at 32 to form skirt portion 31, i.e., reaches a position at which shield 30 is disposed at approximately a 90° angle to surface 12a of target 11. While it is not the intent to be bound by any particular theories of operation, it is believed that expansion of this gap between shield 30 and target 11 as shield 30 is bending or curving at 32 will provide an enhanced opportunity for undesirable deposition on o-ring 8 without a corresponding increase in the redeposition rate due to the proximity of grounded shield 30 to target 11 in this region.

Figure 4:
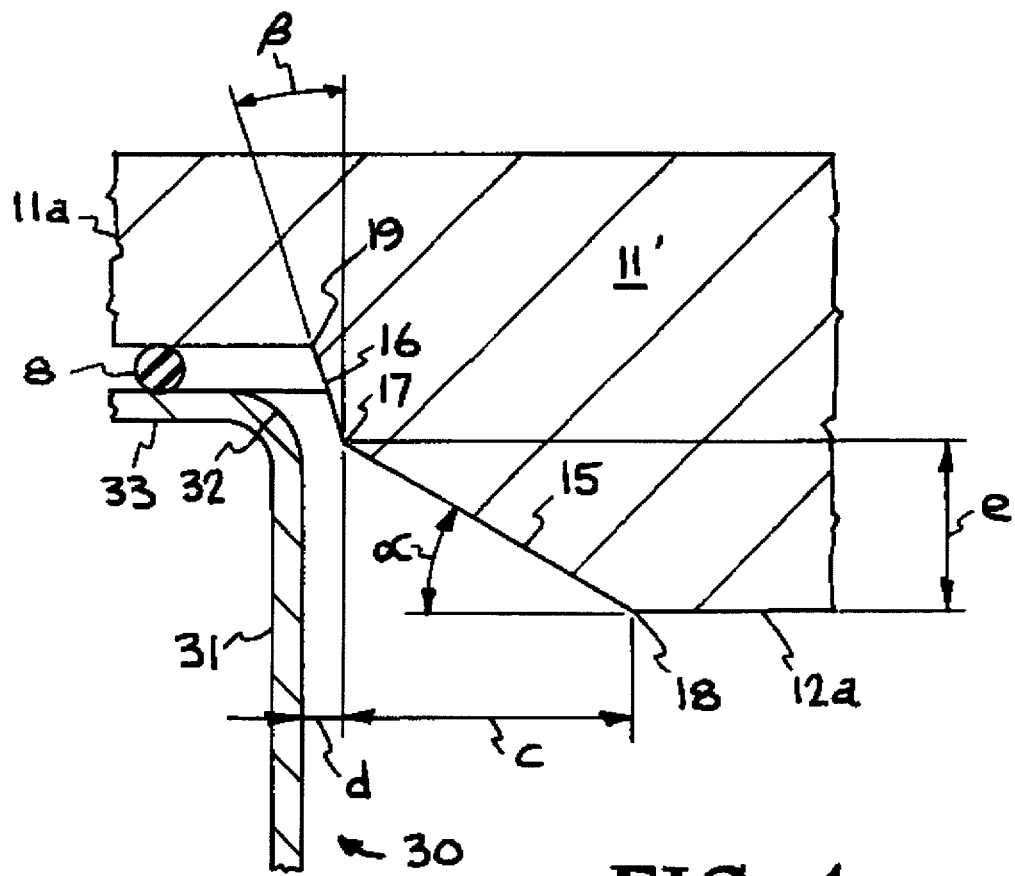
FIG. 4 is a fragmentary vertical side section view of another and preferred embodiment of the tapered target of the invention, having two tapered surfaces.

Therefore, in accordance with a preferred embodiment of the invention, as shown in FIG. 4, a first tapered surface 15 is provided on target 11' which terminates, as shown in FIG. 4, at a point 17 which is a distance e from the commencement of first tapered surface 15 at point 18, i.e., from intersection point 18 of tapered surface 15 with central target surface 12a. Distance c may vary from greater than about 3 mm to less than about 18 mm (greater than about 0.12 inches to less than about 0.72 inches). Preferably, distance c will vary from about 8 mm to about 13 mm (about 0.32 inches to about 0.52 inches) and typically distance c will be about 10.5 mm (about 0.42 inches)

Figure 5:
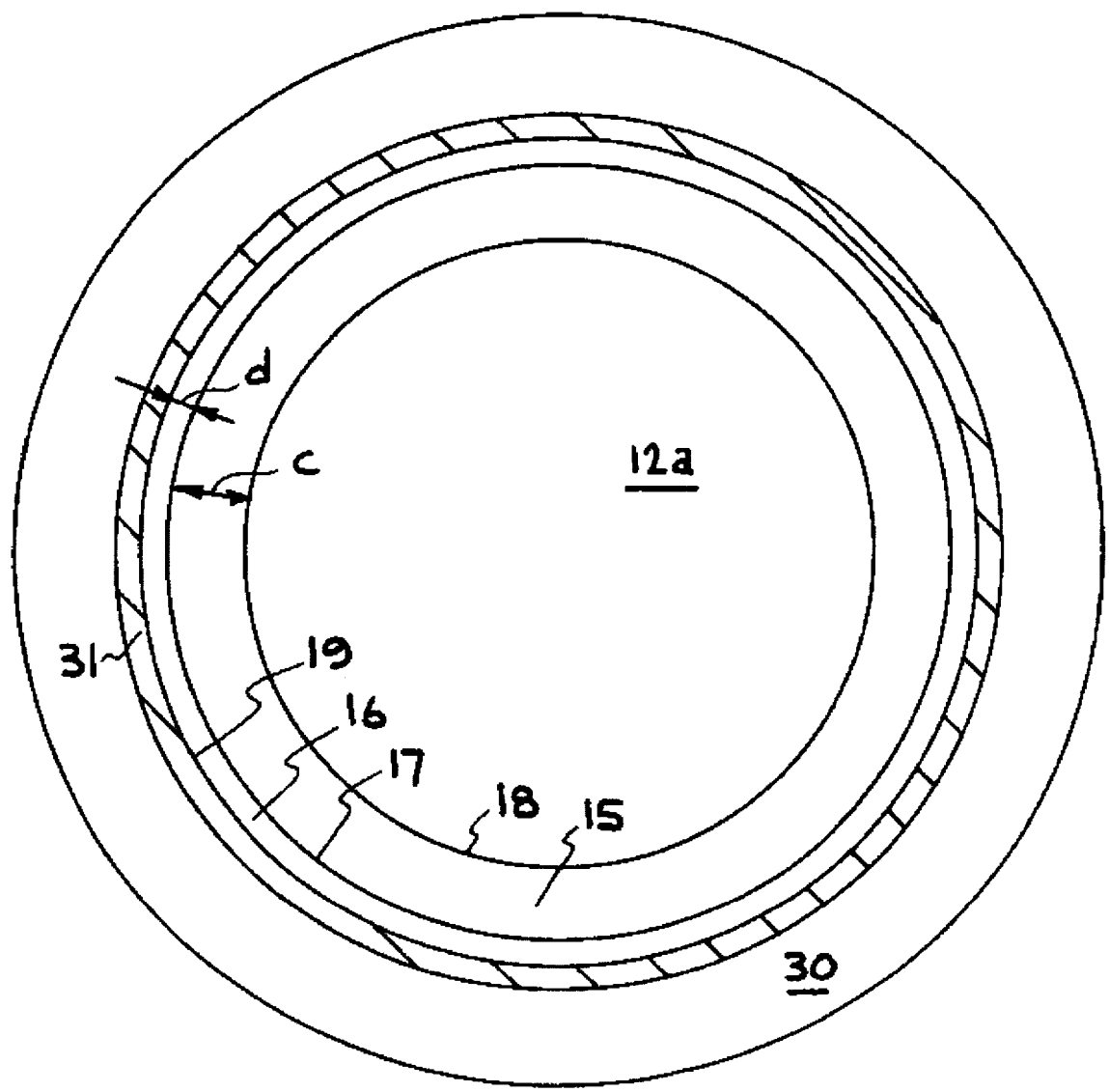
FIG. 5 is a plan view of the shield and tapered target shown in FIG. 4, showing, from beneath, the widths of the respective tapered surfaces.

This will provide a gap or distance d, between point 17 on target 11' and skirt portion 31 of shield 30, as shown in FIGS. 4 and 5, which will vary from about 1.5 mm to about 2.5 mm (about 0.06 inch to about 0.1 inch), typically about 2 mm (about 0.8 inches).

Target 11' is further provided with a second tapered surface 16 which commences at point 17 and extends to point 19, i.e., the commencement of wing portion 11a of target 11'. The slope of second tapered surface 16 defines an angle β with a plane perpendicular to the plane of surface 12a on target 11', i.e., an angle 90° −β with the plane of surface 12a of target 11'. Angle β may vary from about 5° to about 20°, and preferably from about 7° to about 15°. Typically angle β will range from about 10° to about 12°. Target 11' will then provide the desired improvement in reduced redeposition of sputtered target material back on the outer edges of target 11' or on o-ring 8, as well as maintaining the desired spacing or gap d between target 11' and skirt portion 31 of shield 30 extending parallel to wall 6 of deposition chamber 2.

Thus, the invention provides an improved apparatus and process for sputtering, and particularly for reactive sputtering, wherein the front surface of the target facing the substrate to be deposited upon is tapered away from the front surface at the periphery of the target surface, i.e., adjacent the shield, so that redeposition of sputtered material back onto the peripheral portions of the target surface is inhibited.

Having thus described the invention what is claimed is:

1. A sputter deposition apparatus for use in the deposition of materials on a substrate surface for the formation of an integrated circuit structure thereon including a single generally circular sputtering target in said sputter deposition apparatus, said circular sputtering target having a target surface comprising:

a) a central portion of said target surface; and
   b) an outer portion of said target surface, adjacent a grounded shield which surrounds the periphery Of said target, said grounded shield disposed generally normal to the plane of said central portion of said target surface to protect the walls of said sputter deposition apparatus from materials sputtered from said target, said outer portion of said target surface provided with a taper of an angle of at least about 35° with respect to said remaining central portion of said target surface to inhibit redeposition, on said outer portion of said target surface adjacent said grounded shield, of previously sputtered materials.

2. The sputter deposition apparatus of claim 1 wherein the angle of said outer portion of said target surface provided with a taper, with respect to said central portion of said target surface is within a range of from about 35° to about 70°.

3. The sputter deposition apparatus of claim 2 wherein the angle of said outer portion of said target surface provided with a taper, with respect to said central portion of said target surface is within a range of from about 40° to about 60°.

4. The sputter deposition apparatus of claim 2 wherein the intersection of said outer portion of said target surface provided with a taper with said central portion of said target surface is at a distance of from about greater than 5 mm to less than about 20 mm from a circular shield surrounding an end edge of said target, as measured along a line lying in the plane of said central portion of said target surface.

5. The sputter deposition apparatus of claim 2 wherein said outer tapered surface portion of said target commences at said central portion of said target surface at a distance of from about 10 mm to about 15 mm from a circular shield surrounding an end edge of said target, as measured along a line lying in the plane of said central portion of said target surface.

6. A sputter deposition apparatus for use in the deposition of materials on a substrate surface for the formation of an integrated circuit structure thereon comprising a sputtering chamber having a single sputtering target member therein comprising a generally circular central sputtering target portion having a planar surface thereon, and outer mounting wings; wherein an outer portion of said planar surface of said generally circular sputtering target portion, adjacent an outer edge of said central target portion, is tapered at an angle, with respect to said planar surface thereon, which is within a range of from about 35° to about 70°, and which outer tapered surface extends from said planar target surface to said outer mounting wings, said tapered surface commencing at said planar target surface a distance of from greater than 5 mm to less than 20 mm, from a circular grounded shield surrounding said outer edge of said generally circular central sputtering target portion as measured along a line lying in said planar target surface.

7. The sputter deposition apparatus of claim 6 wherein said angle of said outer tapered surface of said target, with respect to said central planar portion of said target surface, is within a range of from about 40° to about 60°.

8. The sputter deposition apparatus suitable of claim 6 wherein said outer portion of said planar surface of said target tapered at an angle extends inwardly from said shield a distance of from about 10 mm to about 15 mm, as measured along said line lying in said planar target surface.

9. The sputter deposition apparatus of claim 6 wherein said outer portion of said planar surface of said target tapered at an angle extends inwardly from said shield a distance of about 12.5 mm, as measured along said line lying in said planar target surface.

10. A sputter deposition apparatus suitable for use in the deposition of materials on a substrate surface for the formation of an integrated circuit structure thereon comprising a sputtering chamber; a single sputtering target member therein comprising an outer edge a generally circular central sputtering target portion having a planar target surface thereon, and outer mounting wings for mounting said target member in said chamber; said central sputtering target portion further comprising:

a) a first tapered surface, commencing at the outer edge of said planar target surface, which is tapered at an angle, with respect to said planar target surface of at least about 35°; and b) a second tapered surface commencing at an outer edge of said first tapered surface and extending to said outer mounting wings.

11. The sputter deposition apparatus of claim 10 wherein said first tapered surface is tapered at an angle, with respect to said planar target surface, which is within a range of from about 35° to about 70°.

12. The sputter deposition apparatus of claim 11 wherein said first tapered surface commences adjacent said planar target surface at a distance of from greater than 5 mm to less than 20 mm from a circular grounded shield surrounding said outer edge of said generally circular central sputtering target portion, as measured along a line lying in said planar target surface; said first tapered surface extending, as measured along said line, to a distance of from about 1.5 mm to about 2.5 mm from said shield.

13. The sputter deposition apparatus of claim 12 wherein said first tapered surface commences adjacent said planar target surface at a distance of from about 10 mm to about 15 mm from said circular ground shield surrounding said outer edge of said generally circular central sputtering target portion, as measured along a line lying in said planar target surface; said first tapered surface extending, as measured along said line, to a distance of from about 1.5 mm to about 2.5 mm from said shield.

14. The sputter deposition apparatus of claim 12 wherein said second tapered surface commences adjacent the outer edge of said first tapered surface and is tapered at an angle, with respect to said planar target surface, ranging from about 70° to about 85°.

15. The sputter deposition apparatus of claim 14 wherein said second tapered surface commences at the outer edge of said first tapered surface and extends to said outer mounting wings a distance of from about 1.5 mm to about 2.5 mm, as measured along a line lying in said planar target surface.

16. The sputter deposition apparatus of claim 12 wherein said second tapered surface commences adjacent the outer edge of said first tapered surface and is tapered at an angle, with respect to said planar target surface, ranging from about 75° to about 83°.

17. The sputter deposition apparatus of claim 10 wherein said first tapered surface is tapered at an angle, with respect to said planar target surface, which is within a range of from about 40° to about 60°.

18. A sputter deposition apparatus for use in the deposition of materials on a substrate surface for the formation of an integrated circuit structure thereon comprising a sputtering chamber; a single sputtering target member therein comprising an outer edge, a generally circular central sputtering target portion having a planar target surface thereon, and outer mounting wings for mounting said target member in said chamber; said central sputtering target portion further comprising:

a) a first tapered surface commencing at the outer edge of said planar target surface, said first tapered surface being tapered at an angle, with respect to said planar target surface, which is within a range of from about 40° to about 60°; and b) a second tapered surface commencing at an outer edge of said first tapered surface and extending to said outer mounting wings, said second tapered surface being tapered at an angle, with respect to said planar target surface, ranging from about 70° to about 85°.

19. The sputter deposition apparatus of claim 18 wherein said first tapered surface commences adjacent said planar target surface at a distance of from about 10 mm to about 15 mm from said circular shield surrounding said outer edge of said generally circular central sputtering target portion, as measured along a line lying in said planar target surface; said first tapered surface extending, as measured along said line, to a distance of from about 1.5 mm to about 2.5 mm from said shield.

20. The sputter deposition apparatus of claim 18 wherein said second tapered surface commences at the outer edge of said first tapered surface and extends to said outer mounting wings a distance of from about 1.5 mm to about 2.5 mm, as measured along a line lying in said planar target surface.

21. A sputter deposition process for use in the deposition of materials on a substrate surface for the formation of an integrated circuit structure thereon which comprises sputtering material from a sputtering target having an outer portion of the target surface thereof adjacent a peripheral grounded shield tapered at an angle of at least 35 degrees with respect to the remaining central portion of said target surface to inhibit redeposition of sputtered material on portions of said target adjacent said shield.

* * * * *